US008874958B2

(12) United States Patent
Gilbert

(10) Patent No.: US 8,874,958 B2
(45) Date of Patent: Oct. 28, 2014

(54) ERROR DETECTION IN A MIRRORED DATA STORAGE SYSTEM

(75) Inventor: David A. Gilbert, Manchester (GB)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 13/288,085

(22) Filed: Nov. 3, 2011

(65) Prior Publication Data

US 2012/0117418 A1    May 10, 2012

(51) Int. Cl.
*G06F 11/00*    (2006.01)
*G06F 11/10*    (2006.01)
*H03M 13/05*    (2006.01)
*G06F 11/20*    (2006.01)
*H03M 13/09*    (2006.01)

(52) U.S. Cl.
CPC ........... *H03M 13/05* (2013.01); *G06F 11/1044* (2013.01); *G06F 11/2082* (2013.01); *H03M 13/09* (2013.01)
USPC ...................................................... 714/6.22

(58) Field of Classification Search
CPC ....................................................... G06F 11/00
USPC ....................................................... 714/6.22
See application file for complete search history.

(56) References Cited

U.S. PATENT DOCUMENTS

| | | | |
|---|---|---|---|
| 4,788,684 A * | 11/1988 | Kawaguchi et al. | 714/719 |
| 6,052,816 A * | 4/2000 | Yoshinogawa | 714/766 |
| 7,386,754 B2 * | 6/2008 | Cronch | 714/5.11 |
| 8,010,879 B2 * | 8/2011 | Katoh et al. | 714/781 |
| 8,200,925 B2 * | 6/2012 | Oh et al. | 711/162 |
| 8,341,499 B2 * | 12/2012 | Pescatore | 714/773 |
| 8,392,797 B2 * | 3/2013 | Cheng et al. | 714/763 |
| 8,645,789 B2 * | 2/2014 | Sharon et al. | 714/755 |
| 2002/0120647 A1 * | 8/2002 | Amano | 707/501.1 |
| 2008/0005646 A1 | 1/2008 | Bains | |
| 2009/0222622 A1 | 9/2009 | Petrescu et al. | |
| 2010/0252106 A1 * | 10/2010 | Peng et al. | 136/259 |
| 2013/0198587 A1 * | 8/2013 | Kim et al. | 714/763 |
| 2014/0006898 A1 * | 1/2014 | Sharon et al. | 714/755 |

FOREIGN PATENT DOCUMENTS

CN    101800084 A    8/2010

OTHER PUBLICATIONS

IBM Technical Disclosure, "Corruption-Resistant Data Porting with Multiple Error Correction Schemes," IP.com, Oct. 15, 2006.

* cited by examiner

*Primary Examiner* — Amine Riad
(74) *Attorney, Agent, or Firm* — Roy W. Truelson

(57) ABSTRACT

A method and system for are provided for error detection in a mirrored data storage system. The method includes a first mirrored system applying a first error correction code (ECC) algorithm and a second mirrored system applying a second error correction code algorithm. The method reads recovered data in each of the first and second mirrored systems and processes the recovered data in each of the first and second mirrored systems by applying both first and second error correction code algorithms to produce four calculated error correction code values. The method uses the calculated error correction code values to determine the correct recovered data of the first and second mirrored systems.

15 Claims, 5 Drawing Sheets

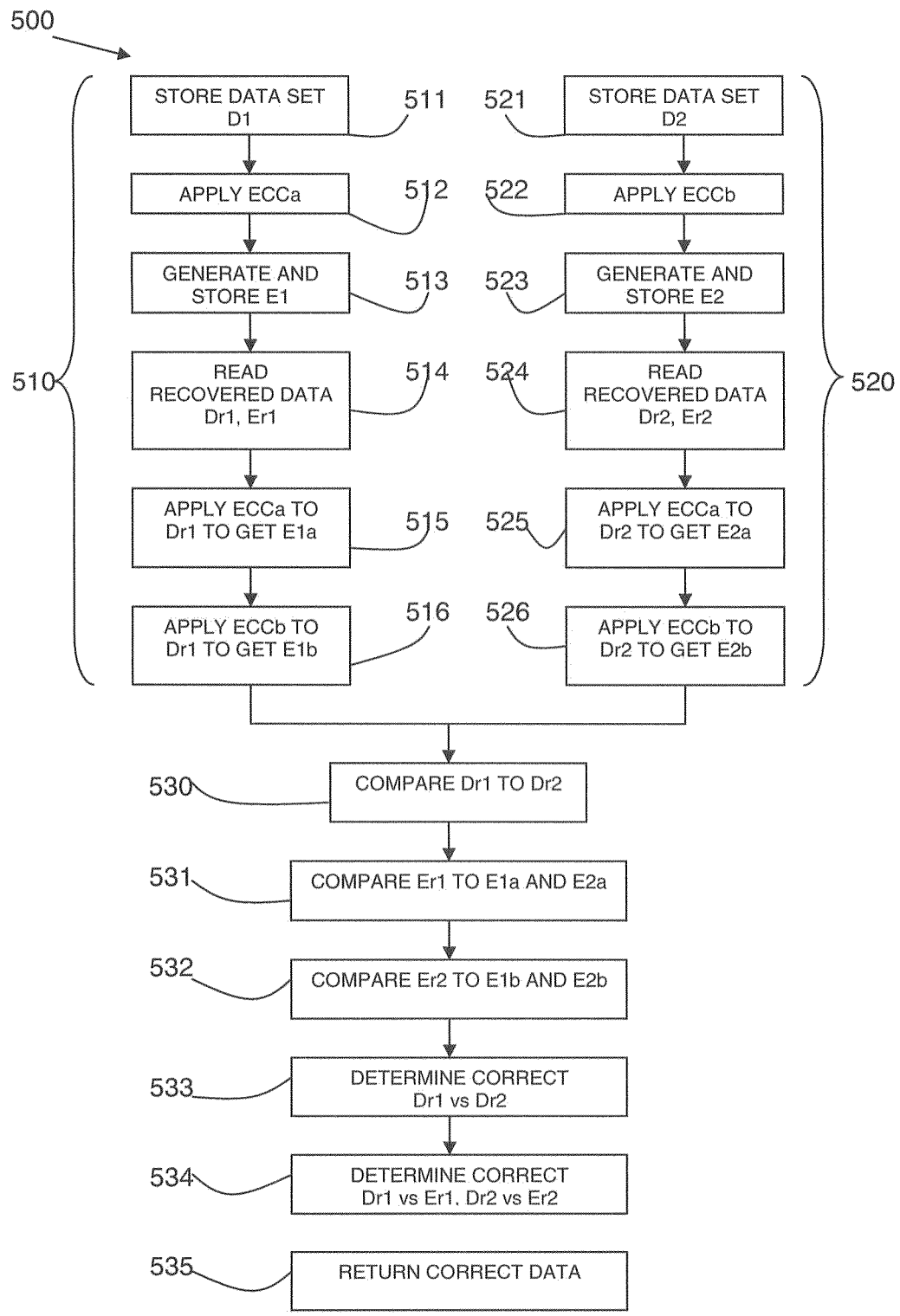

ERROR DETECTION IN A MIRRORED DATA STORAGE SYSTEM

FIELD OF THE INVENTION

This invention relates to the field of mirrored data storage systems. In particular, the invention relates to error detection in a mirrored data storage system.

BACKGROUND OF THE INVENTION

In a storage system (such as a disk system or memory subsystem of a computer) it is common to replicate or mirror the storage to continue operation after failure; in a memory subsystem this is referred to as Memory Mirroring, and on disk storage systems as RAID 1.

It is recognized that disks are an inherently unreliable component of computer systems. Mirroring is a technique to allow a system to automatically maintain multiple copies of data so that in the event of a disk hardware failure a system can continue to process or quickly recover data. Mirroring may be done locally where it is specifically to cater for disk unreliability, or it may be done remotely where it forms part of a more sophisticated disaster recovery scheme, or it may be done both locally and remotely, especially for high availability systems. Normally data is mirrored onto physically identical drives, though the process can be applied to logical drives where the underlying physical format is hidden from the mirroring process. Typically mirroring is provided in either hardware solutions such as disk arrays or in software within the operating system.

In working storage systems it is not unusual to find small numbers of errors in the values read back from storage. In the case of random access memory (RAM), errors occur due to failed cells and temporary failures due to the interaction of alpha particles or cosmic rays within the RAM. To deal with these rare errors, systems include Error Correction Codes (ECC).

ECCs store some extra bits of data as a digest of a block of storage. When reloading the data the ECC (Ec) is recalculated from the loaded data (Dr) and compared with the ECC digest read from storage (E). If they differ, the ECC can indicate (for some errors) which bit to toggle to recover the original value.

Any particular ECC system has a limit to the number of errors that it can detect and how many errors it can correct in a given block of storage. For example, an ECC system may guarantee to hold enough information to correct a single bit error or detect pairs of errors. In such a system, if 3 bits in the block are corrupt, the ECC may or may not detect it, and if not detected, the system has no way of differentiating between it and a correct value.

In a system with both mirroring and ECC, the two are typically independent—in the sense that each side of the mirror has ECC, and if the ECC detects an uncorrectable error the only option is to use the data from the other mirrors.

Referring to FIG. 1, a schematic representation shows a mirrored data system 100 including a first mirror 110 and a second mirror 120.

The first mirror 110 a data set D1 111 which is stored in a storage medium. An ECC algorithm 130 is applied to the data set D1 111 to produce an ECC value E1 112.

Similarly, the second mirror 120 a data set D2 121 which is stored in a storage medium. The same ECC algorithm 130 is applied to the data set D2 121 to produce an ECC value E2 122.

Recovered data 151 in the first mirror 110, includes recovered data set Dr1 113 which is read from the storage medium and should be the same as the data set D1 111 (shown by hashed line). The recovered data set Dr1 113 has the ECC algorithm 130 applied to it to produce an expected ECC value Ec1 114. A recovered ECC value Er1 115 is also read from the storage medium and should be the same as the ECC value E1 112 (shown by hashed line).

Recovered data 152 in the second mirror 120, includes recovered data set Dr2 123 which is read from the storage medium and should be the same as the data set D2 121. The recovered data set Dr2 123 has the ECC algorithm 130 applied to it to produce an expected ECC value Ec2 124. A recovered ECC value Er2 125 is also read from the storage medium and should be the same as the ECC value E2 122 (shown by hashed line).

Each mirror has a set of Data (D1, D2) and a set of ECC values (E1, E2). The same algorithm is used for both mirrors so that E1=ECC(D1) and E2=ECC(D2). On read, the recovered data (Dr1, Dr2) is used to calculate the expected ECC values Ec1=ECC(Dr1), Ec2=ECC(Dr2). If Ec1=E1 then D1 is valid, if Ec2=E2 then D2 is valid. A mismatch indicates either the data or the ECC data is corrupt. If either one matches, that data is assumed to be correct. If both match then the choice is arbitrary. Errors that the ECC does not detect will allow the corrupted data to be read.

It would be possible to also compare Dr1 and Dr2 to detect errors. If Dr1 and Dr2 do not match (even if the error correction passed), then an ECC undetected error has been detected but cannot be corrected since it is not possible to know which of Dr1 and Dr2 is correct.

As the size of compute clusters grows and storage sizes increase the number of errors in the whole system increases.

SUMMARY OF THE INVENTION

According to a first aspect of the present invention there is provided a method for error detection in a mirrored data storage system, comprising: a first mirrored system applying a first error correction code (ECC) algorithm; a second mirrored system applying a second error correction code algorithm; reading recovered data in each of the first and second mirrored systems; processing recovered data in each of the first and second mirrored systems by applying both first and second error correction code algorithms to produce four calculated error correction code values; and using the calculated error correction code values to determine the correct recovered data of the first and second mirrored systems.

According to a second aspect of the present invention there is provided a computer software product for error detection in a mirrored data storage system, the product comprising a computer-readable storage medium having computer readable program code embodied therewith, the computer readable program code configured to: apply in a first mirrored system a first error correction code (ECC) algorithm; apply in a second mirrored system a second error correction code algorithm; read recovered data in each of the first and second mirrored systems; process recovered data in each of the first and second mirrored systems by applying both first and second error correction code algorithms to produce four calculated error correction code values; and use the calculated error correction code values to determine the correct recovered data of the first and second mirrored systems.

According to a third aspect of the present invention there is provided a system for error detection in a mirrored data storage system, comprising: a first mirrored system applying a first error correction code (ECC) algorithm; a second mirrored system applying a second error correction code algorithm; a data recovery component for reading recovered data in each of the first and second mirrored systems; an error correction code applier component for processing recovered data in each of the first and second mirrored systems by applying both first and second error correction code algorithms to produce four calculated error correction code values; and a comparator component using the calculated error correction code values to determine the correct recovered data of the first and second mirrored systems.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings in which:

FIG. 5 is a flow diagram of a method in accordance with the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A method and system are described in which in a mirrored data storage system, different error checking and correction (ECC) algorithms are used for the two mirrored data copies. Errors may be detected by one ECC algorithm and not the other. The read data recovered is processed by both ECC algorithms to produce four calculated ECC values, and each compared with each other one. The correct mirror can be determined by use of cross-comparison of the two ECC sets. Additionally, the pair of ECC values in a mirror can be used to distinguish between corrupt data and corrupt ECC data.

Figure 1:
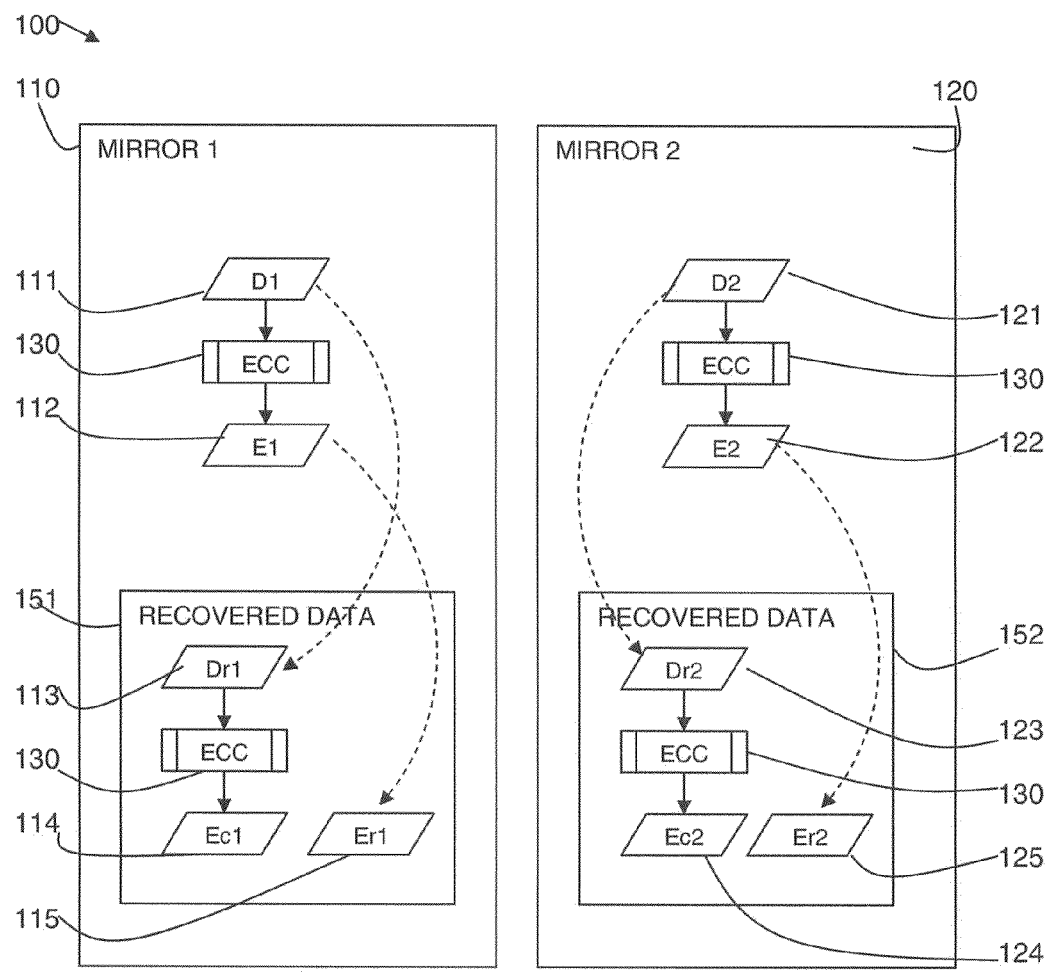
FIG. 1 (Prior Art) is a schematic diagram of a mirror data system as known in the prior art.
Figure 2:
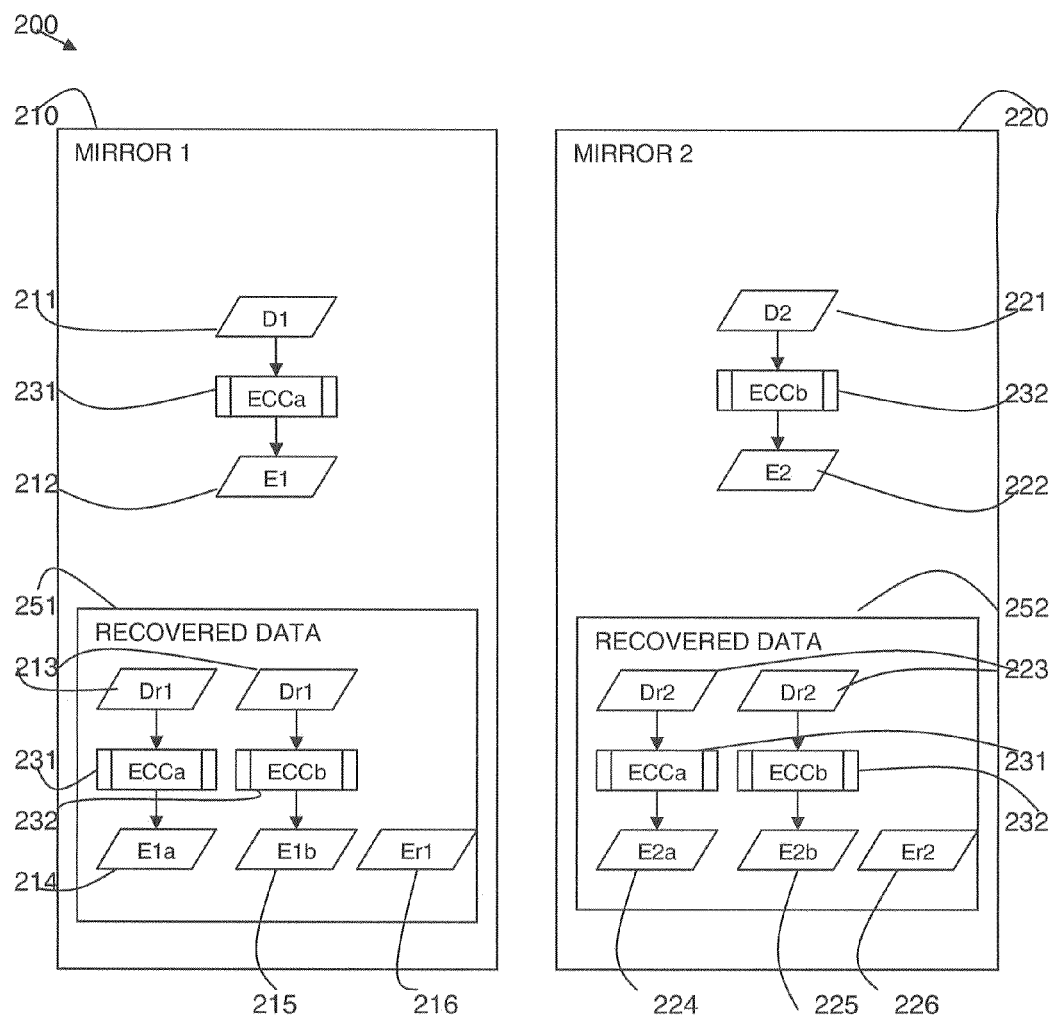
FIG. 2 is a schematic diagram of a mirrored data system in accordance with the present invention.

Referring to FIG. 2, a schematic diagram shows a mirrored data system 200 including a first mirror 210 and a second mirror 220.

The first mirror 210 has a data set D1 211 stored in a storage medium. A first ECC algorithm, ECCa 231 is applied to the data set D1 211 to produce an ECC value E1 212 which is also stored.

The second mirror 220 has a data set D2 221 stored in a storage medium. A second, different ECC algorithm ECCb 232 is applied to the data set D2 221 to produce an ECC value E2 222 which is also stored.

Recovered data 251 in the first mirror 210 includes recovered data set Dr1 213 which has both the first and second ECC algorithms, ECCa 231 and ECCb 232, applied to it to produce ECC values E1$a$ 214 and E1$b$ 215 respectively.

Recovered data 252 in the second mirror 220 includes recovered data set Dr2 223 which has both the first and second ECC algorithms, ECCa 231 and ECCb 232, applied to it to produce ECC values E2$a$ 224 and E2$b$ 225 respectively.

In addition, recovered data 251, 252 includes recovered ECC values in each mirror Er1 216 and Er2 226.

Different ECC algorithms are used for the two mirrors such that, E1=ECCa(D1) and E2=ECCb(D2). This works on the assumption that with two ECC algorithms there will be errors that are detected by one algorithm but not the other one, and thus results in a system more resilient in case of an undetected error.

On read, the recovered data (Dr1, Dr2) is now processed by both ECC algorithms to produce 4 calculated ECC values: E1$a$, E1$b$, E2$a$, E2$b$ (where Enx is ECC algorithm x on data n). The comparisons that can now be made against the recovered ECC data (Er1, Er2) are:

Er1=E1$a$, Er1=E2$a$, Er2=E2$b$, Er2=E1$b$. Each comparison can yield 3 results:

(x) Match, (y) Mismatch (ECC can correct), (z) Mismatch (ECC cannot correct).

The result of any such comparison is not necessarily the real result; for example, a match can occur if so much corruption of either Er or Dr occurs that it looks like another valid result. A mismatch can occur from a corruption of either or both of Er and Dr.

The described system with mirrored storage in which each mirror has a different ECC, enables reads to be performed from both mirrors and compared to detect corruption otherwise undetected by ECC.

A first data comparison may be carried out between the recovered data of the two mirrors Dr1 and Dr2. Where the data comparison (Dr1≠Dr2) mismatches, the correct mirror is determined by use of cross comparison of the two ECC sets.

If E1$b$≠Er2 but E2$a$=Er1, then Dr1 is corrupt and Dr2 is good. Dr1 is corrupt because Dr1 is used to generate E1$b$, which does not match the recovered Er2. Dr2 is good because Dr2 is used to generated E2$a$ which does match recovered Er1, indicating that Dr2 is good.

It is also possible to gain benefit without carrying out the Dr1, Dr2 data comparison. In a system with mirrored storage in which each mirror has a different ECC, it is possible to use the pair of ECC values to distinguish between corrupt data (Dr1, Dr2) and corrupt ECC data (Er1, Er2).

If Er1≠E1$a$ and Er2≠E1$b$ then Dr1 is most likely corrupt since both of it's ECCs mismatch. Where as if Er1≠E1$a$ and Er1≠E2$b$ then it is likely that Er1 is corrupt rather than the data, since both the ECCs that use Er1 mismatch.

Figure 3:
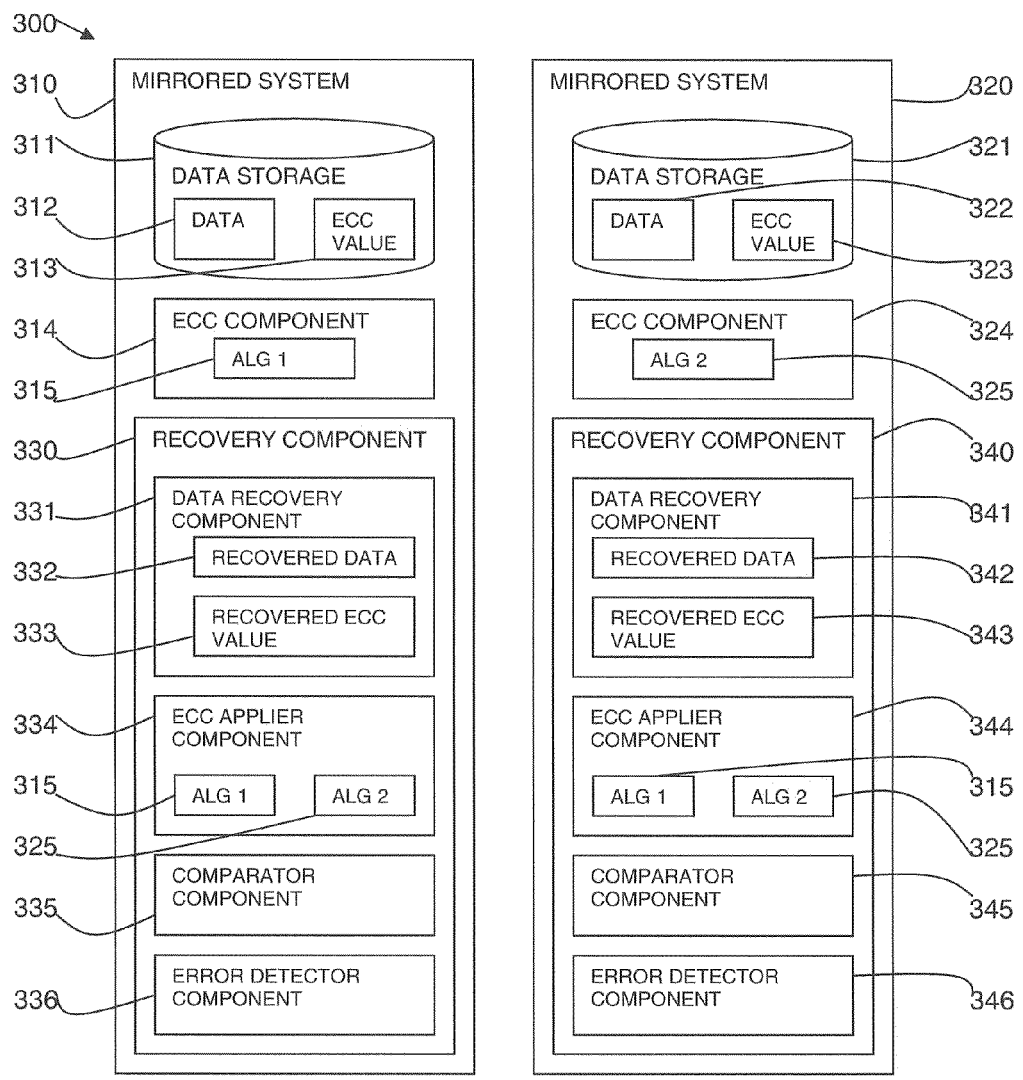
FIG. 3 is a block diagram of a system in accordance with the present invention.

Referring to FIG. 3, a block diagram shows an embodiment of the described system 300. Each mirrored system 310, 320 includes a data storage 311, 321 including stored data 312, 322 and stored ECC values 313, 323 as calculated by an ECC component 314, 324. The two mirrored systems 310, 320 each use different ECC algorithms in their ECC components 314, 324, algorithm 1 315, and algorithm 2 325 respectively.

Each mirrored system 310, 320 has a recovery component 330, 340. The recovery components 330, 340 include a data recovery component 331, 341 for recovering data 332, 342 and ECC values 333, 343. An ECC applier component 334, 344 is provided which applies both ECC algorithms, algorithm 1 315 and algorithm 2 325 (the ECC algorithm of its own system, and the ECC algorithm of the other mirrored system) to the recovered data.

The recovery component 330, 340 includes a comparator component 335, 345 for comparing the recovered data with the other mirrored system, and the recovered ECC value with the ECC applier component results. An error detector component 336, 346 determines the correct data values.

Figure 4:
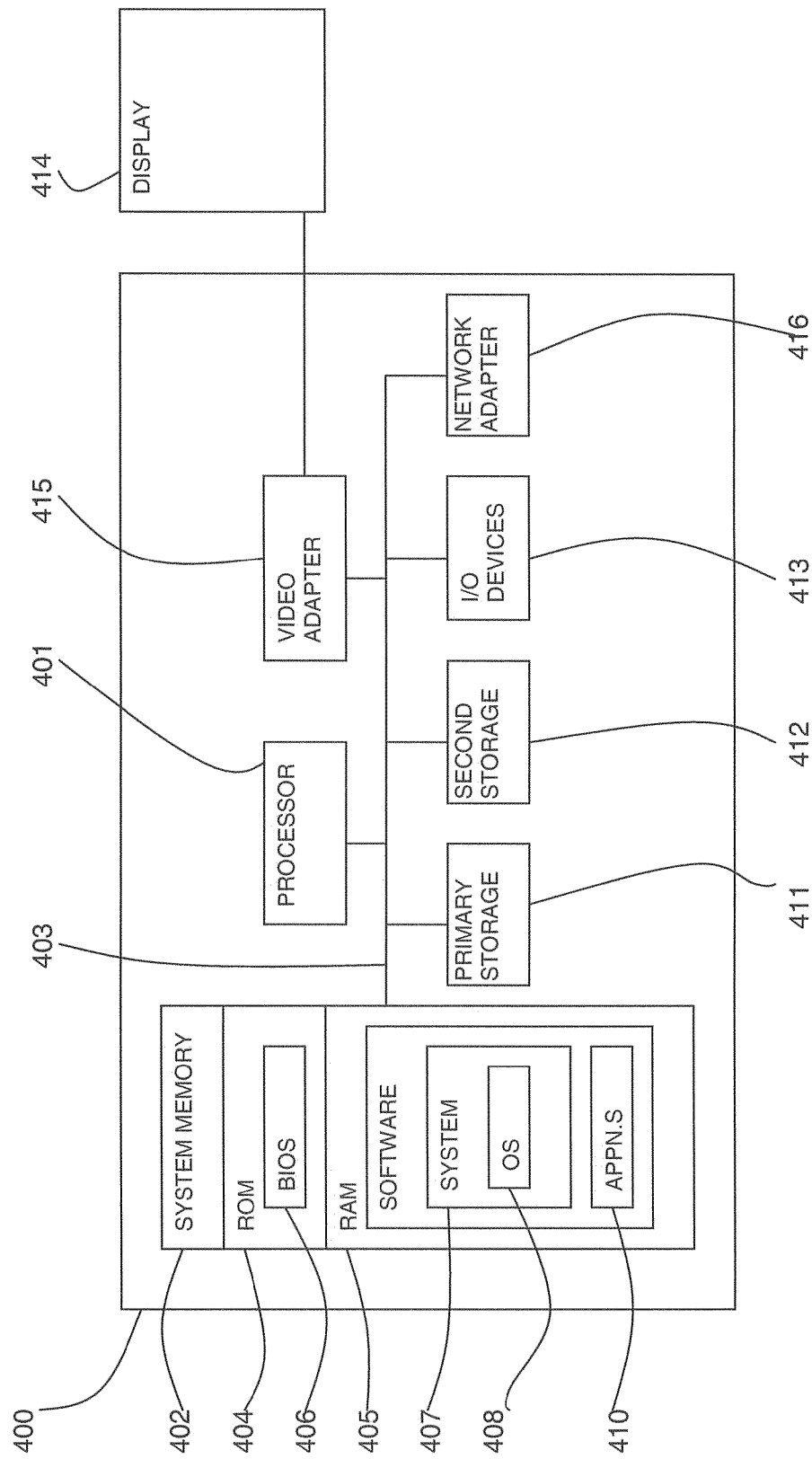
FIG. 4 is a block diagram of a computer system in which the present invention may be implemented.

Referring to FIG. 4, an exemplary system for implementing aspects of the invention includes a data processing system 400 suitable for storing and/or executing program code including at least one processor 401 coupled directly or indirectly to memory elements through a bus system 403. The memory elements can include local memory employed during actual execution of the program code, bulk storage, and cache memories which provide temporary storage of at least some program code in order to reduce the number of times code must be retrieved from bulk storage during execution.

The memory elements may include system memory 402 in the form of read only memory (ROM) 404 and random access memory (RAM) 405. A basic input/output system (BIOS) 406 may be stored in ROM 404. System software 407 may be stored in RAM 405 including operating system software 408. Software applications 410 may also be stored in RAM 405.

The system 400 may also include a primary storage means 411 such as a magnetic hard disk drive and secondary storage means 412 such as a magnetic disc drive and an optical disc drive. The drives and their associated computer-readable media provide non-volatile storage of computer-executable instructions, data structures, program modules and other data for the system 400. Software applications may be stored on the primary and secondary storage means 411, 412 as well as the system memory 402.

The computing system 400 may operate in a networked environment using logical connections to one or more remote computers via a network adapter 416.

Input/output devices 413 can be coupled to the system either directly or through intervening I/O controllers. A user may enter commands and information into the system 400 through input devices such as a keyboard, pointing device, or other input devices (for example, microphone, joy stick, game pad, satellite dish, scanner, or the like). Output devices may include speakers, printers, etc. A display device 414 is also connected to system bus 403 via an interface, such as video adapter 415.

Referring to FIG. 5, a flow diagram 500 shows an embodiment of the described method. A left side 510 of the flow 500 shows the process in a first mirrored system and the right side 520 of the flow 500 shows the process in a second mirrored system.

In the first mirrored system, a data set D1 is stored 511. A first ECC algorithm, ECCa, is applied 512 to generate 513 ECC value, E1, which is also stored. On read recovery, data and ECC values, Dr1, Er1, are recovered 514. The first ECC algorithm, ECCa, is applied 515 to the recovered data Dr1 to generate E1$a$. A second ECC algorithm, ECCb, as used in the other mirrored system, is applied 516 to the recovered data Dr1 to generated E1$b$.

In the second mirrored system, a data set D2 is stored 521. A second ECC algorithm, ECCb, is applied 522 to generate 523 ECC value, E2, which is also stored. On read recovery, data and ECC values, Dr2, Er2, are recovered 524. The first ECC algorithm, ECCa, as used in the other mirrored system, is applied 525 to the recovered data Dr2 to generate E2$a$. The second ECC algorithm, ECCb, is applied 526 to the recovered data Dr2 to generated E2$b$.

The results are then compared between the two mirrored systems. The recovered data of the first system, Dr1, may be compared 530 to the recovered data of the second system, Dr2. The recovered ECC value of the first system, Er1, may be compared 531 to the calculated ECC values determined from Dr1 and Dr2 using the first ECC algorithm E1$a$ and E2$a$. The recovered ECC value of the second system, Er2, may be compared 532 to the calculated ECC values determined from Dr1 and Dr2 using the second ECC algorithm E1$b$ and E2$b$.

The cross-comparisons may determine 533 the correct value of Dr1 or Dr2. The cross-comparisons may also determine 534 if it is the recovered data Dr1/Dr2 or recovered ECC value Er1/Er2 which is correct. The correct data may then be returned 535.

The invention can take the form of an entirely hardware embodiment, an entirely software embodiment or an embodiment containing both hardware and software elements. In the case of physical memory, a hardware implementation is likely to be used. In the case of disk storage, either hardware or software may be used.

The invention may take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

Improvements and modifications can be made to the foregoing without departing from the scope of the present invention.

The invention claimed is:

1. A method for error detection in a mirrored data storage system, comprising:

storing a first copy of a data set and a first error correction code (ECC) value in a first mirrored system, the first ECC value being produced by applying a first error correction code (ECC) algorithm to said data set;

storing a second copy of said data set and a second ECC value in a second mirrored system, the second ECC value being produced by applying a second ECC algorithm to said data set, said second ECC algorithm being different from said first ECC algorithm;

reading the stored first copy of said data set in said first mirrored system and the stored second copy of said data set in said second mirrored system to produce a recovered first copy of said data set and a recovered second copy of said data set, respectively;

producing a first calculated ECC value by applying said first ECC algorithm to said recovered first copy of said data set, producing a second calculated ECC value by applying said second ECC algorithm to said recovered first copy of said data set, producing a third calculated ECC value by applying said first ECC algorithm to said recovered second copy of said data set, and producing a fourth calculated ECC value by applying said second ECC algorithm to said recovered second copy of said data set; and using the calculated error correction code values to determine the correct recovered data of the first and second mirrored systems.

2. The method as claimed in claim 1, including:
reading the stored first ECC value in said first mirrored system and the stored second ECC value in said second mirrored system to produce a recovered first ECC value and a recovered second ECC value, respectively.

3. The method as claimed in claim 2, including:
comparing the recovered first ECC value with the first and third calculated ECC values.

4. The method as claimed in claim 2, including:
comparing the recovered second ECC value with the second and fourth calculated ECC values.

5. The method as claimed in claim 1, including:
determining which of the recovered first copy of said data set and recovered second copy of said data set is correct.

6. The method as claimed in claim 2, including:
determining which of the recovered copy of said data set and the recovered ECC value of one of the mirrored systems is correct.

7. The method as claimed in claim 1, wherein the mirrored data storage system is selected from the group consisting of: a memory subsystem using memory mirroring, or a disk storage system using a redundant array of inexpensive disks (RAID) system.

8. A computer software product for error detection in a mirrored data storage system, the product comprising a non-transitory computer-readable storage medium having computer readable program code embodied therewith, wherein the computer readable program code, when executed by at least one computer system, causes the at least one computer system to:
apply in a first mirrored system a first error correction code (ECC) algorithm to a data set to produce a first ECC value, wherein a first copy of said data set and the first ECC value are stored in said first mirrored system;
apply in a second mirrored system a second error correction code algorithm to said data set to produce a second ECC value, wherein a second copy of said data set and the second ECC value are stored in said second mirrored system, the second ECC algorithm being different from the first ECC algorithm;
read the stored first copy of said data set in said first mirrored system and the stored second copy of said data set in said second mirrored system to produce a recovered first copy of said data set and a recovered second copy of said data set, respectively;
produce a first calculated ECC value by applying said first ECC algorithm to said recovered first copy of said data set, produce a second calculated ECC value by applying said second ECC algorithm to said recovered first copy of said data set, produce a third calculated ECC value by applying said first ECC algorithm to said recovered second copy of said data set, and produce a fourth calculated ECC value by applying said second ECC algorithm to said recovered second copy of said data set; and
use the calculated error correction code values to determine the correct recovered data of the first and second mirrored systems.

9. A system for error detection in a mirrored data storage system, comprising:

a first mirrored system, said first mirrored system storing first copy of a data set and a first error correction code (ECC) value, the first ECC value being produced by applying a first error correction code (ECC) algorithm to said data set;
a second mirrored system, said second mirrored system storing a second copy of said data set and a second ECC value, the second ECC value being produced by applying a second ECC algorithm to said data set, said second ECC algorithm being different from said first ECC algorithm;
a data recovery component that reads the stored first copy of said data set in said first mirrored system and the stored second copy of said data set in said second mirrored system to produce a recovered first copy of said data set and a recovered second copy of said data set, respectively;
an error correction code applier component that produces a first calculated ECC value by applying said first ECC algorithm to said recovered first copy of said data set, produces a second calculated ECC value by applying said second ECC algorithm to said recovered first copy of said data set, produces a third calculated ECC value by applying said first ECC algorithm to said recovered second copy of said data set, and produces a fourth calculated ECC value by applying said second ECC algorithm to said recovered second copy of said data set; and
a comparator component that uses the calculated ECC values produced by the error correction code applier component to determine the correct recovered data of the first and second mirrored systems.

10. The system as claimed in claim 9, wherein:
the data recovery component further reads the stored first ECC value in said first mirrored system and the stored second ECC value in said second mirrored system to produce a recovered first ECC value and a recovered second ECC value, respectively.

11. The system as claimed in claim 10, wherein:
the comparator component compares the recovered first ECC value with the first and third calculated ECC values.

12. The system as claimed in claim 10, wherein:
the comparator component compares the recovered second ECC value with the second and fourth calculated ECC values.

13. The system as claimed in claim 9, including:
an error detection component for determining which of the recovered first copy of said data set and recovered second copy of said data set is correct.

14. The system as claimed in claim 9, including:
an error detection component for determining which of the recovered copy of said data set and the recovered ECC value of one of the mirrored systems is correct.

15. The system as claimed in claim 9, wherein the mirrored data storage system is one of the group of: a memory subsystem using memory mirroring, or a disk storage system using a redundant array of inexpensive disks (RAID) system.

* * * * *

UNITED STATES PATENT AND TRADEMARK OFFICE
CERTIFICATE OF CORRECTION

Page 1 of 1

PATENT NO. : 8,874,958 B2
APPLICATION NO. : 13/288085
DATED : October 28, 2014
INVENTOR(S) : David A. Gilbert It is certified that error appears in the above-identified patent and that said Letters Patent is hereby corrected as shown below:

On the Title Page, please add

Item (30)   Foreign Application Priority Data
Nov. 9, 2010   (EP) .......................................... 10190468

Signed and Sealed this
Thirteenth Day of January, 2015

Michelle K. Lee
*Deputy Director of the United States Patent and Trademark Office*